(12) United States Patent
Choi

(10) Patent No.: US 7,840,932 B2
(45) Date of Patent: Nov. 23, 2010

(54) DEFOCUS DETERMINATION METHOD USING SUB-RESOLUTION FEATURE (SRF) PRINTING

(75) Inventor: Yong Seok Choi, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 763 days.

(21) Appl. No.: 11/746,970

(22) Filed: May 10, 2007

(65) Prior Publication Data
US 2008/0278701 A1  Nov. 13, 2008

(51) Int. Cl.
*G06F 17/50* (2006.01)
(52) U.S. Cl. .............................. 716/19; 716/20; 716/21
(58) Field of Classification Search ............ 716/19–21; 430/5, 30, 311
See application file for complete search history.

(56) References Cited

U.S. PATENT DOCUMENTS 7,512,928 B2 * 3/2009 Jessen et al. .................. 716/21

* cited by examiner

*Primary Examiner*—Paul Dinh
(74) *Attorney, Agent, or Firm*—Warren L. Franz; Wade J. Brady, III; Frederick J. Telecky, Jr.

(57) ABSTRACT

The present application is directed to apparatus and methods for determining a magnitude of defocus and a direction of defocus for a photolithography process. A sub-resolution feature on a reticle which is not printed on a wafer at the best focus offset, but is formed on a wafer at some defocus during the photolithography process is analyzed to determine the magnitude and direction of defocus. The magnitude and direction of defocus are used to adjust the photolithography process to an optimal focus based on the determined magnitude of defocus and the determined direction of defocus.

7 Claims, 14 Drawing Sheets

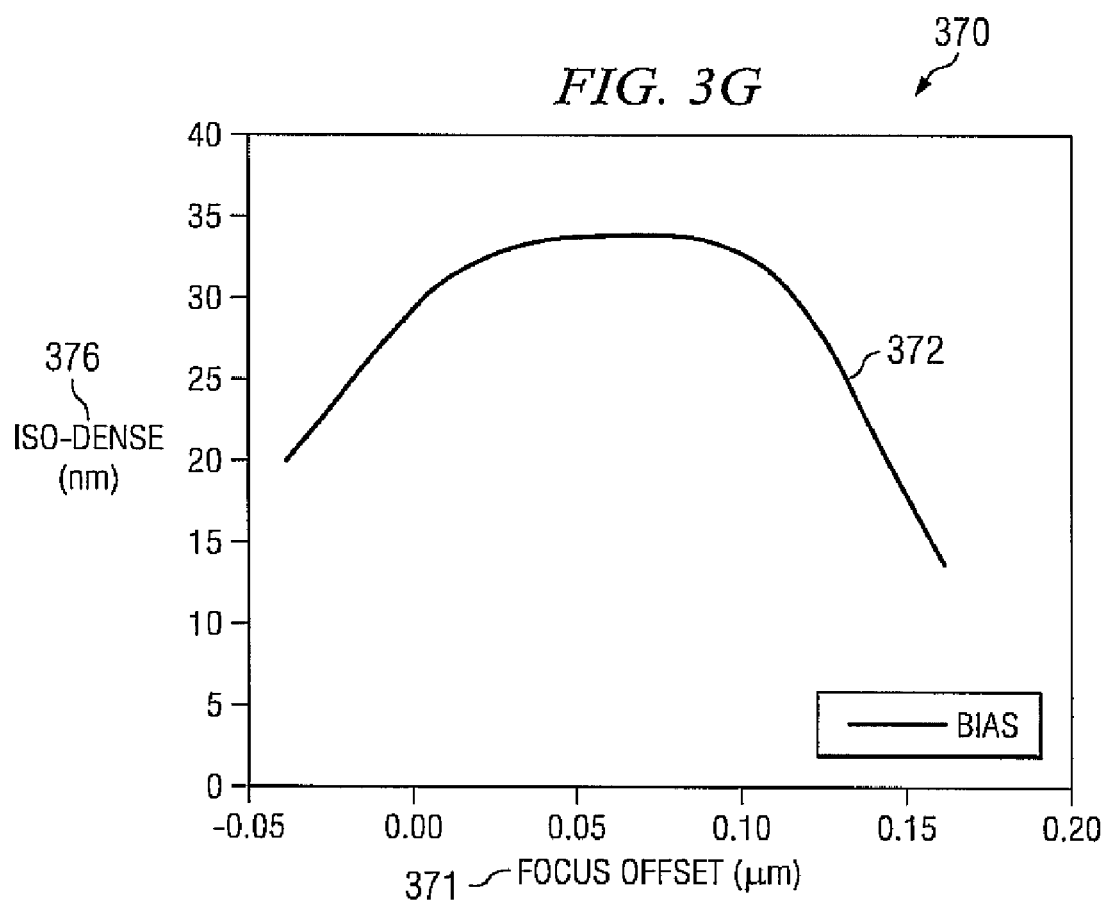

DEFOCUS DETERMINATION METHOD USING SUB-RESOLUTION FEATURE (SRF) PRINTING

FIELD

The teachings relate generally to photolithography for forming integrated circuit devices. More particularly, the teachings relate to methods and devices for correcting for focusing errors.

BACKGROUND

As used herein, isolate refers to a feature that does not have neighboring geometries that can affect optical proximity effect around. In general if a feature does not have any neighbor within ~1 um, it can be considered isolated.

As used herein, dense refers to a feature that has neighboring geometries at approximate minimum widths and spaces allowed by a design rule.

Lithographic projection apparatus (tools) can be used, for example, in the manufacture of integrated circuits (ICs). When using the various tools, a mask can be used that contains a circuit pattern corresponding to an individual layer of the IC, and this pattern, usually having many designs, can be imaged onto a target portion (e.g., comprising one or more dies) of a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time.

One of the goals in IC fabrication is to faithfully reproduce the original circuit design on the wafer using the mask or reticle. However, reproduction of the original circuit design is complicated from one IC to the next as the focusing of the lithographic projection apparatus may drift either in a positive or negative direction.

To monitor for focusing errors during the photolithography process, the Critical Dimensions (CDs) of dense and isolate patterns are measured by a Critical Dimension Scanning Electron Microscope (CDSEM) after a group of wafers are patterned on a lithography tool. Isolate patterns are usually more sensitive to the projected image's focus offset, the CDs change very rapidly as the image plane gets away from the optimum position, while dense CDs gradually change through focus offsets, i.e., the dense and isolate patterns have different magnitudes of variation with defocusing. The measured dense/isolate CDs and their differences or bias show if the wafer was patterned with appropriate energy at an optimum image plane.

While the absolute amount of defocus can be estimated by using dense-isolate CD bias analysis, it is difficult to determine if the focus has drifted in a positive or negative direction. Conventionally, to determine a direction of defocus, another exposure/focus matrix wafer is patterned and inspected by CDSEM. Typically this process takes a few hours of engineer resources to complete and creates significant manufacturing delay.

An alternative conventional technique to determine the amount of positive or negative defocus is to use in-situ focus monitoring. In-situ focus monitoring uses a ~90 degree phase shift pattern on a production reticle to find the focus drift direction, as shown in U.S. Pat. Nos. 5,300,786 and 7,056,625. However, in-situ focus monitoring is very complicated and an expensive addition to a reticle manufacturing process.

Another alternative conventional technique to determine the amount of positive or negative defocus is to use a focus monitor structure, i.e., a series of densely packed lines and an orthogonal line, that is placed on a reticle or mask near the production device structures, such as integrated circuits, to monitor the focal conditions of the lithography process as well as other parameters, such as a critical dimension, and proximity effects, as disclosed by U.S. Pat. No. 6,063,531. By manually or automatically inspecting the focus monitor structure after it is patterned into a layer of resist, including measuring the width of the resist lines and the resist profile angle of the orthogonal line, information relating to the critical dimension as well as the focal conditions of the lithography process can be determined.

Thus, there is a need to overcome these and other problems of the prior art to determine the direction of defocus during a lithography process.

SUMMARY

In accordance with an exemplary embodiment, one embodiment of the present application is directed to an apparatus for determining a magnitude of defocus and direction of defocus for photolithography. The apparatus comprises an analyzer to analyze a wafer for a sub-resolution feature. A magnitude determiner is relied on by the apparatus to determine a magnitude of the sub-resolution feature on the wafer. A defocus magnitude determiner allows the apparatus to determine the magnitude of defocus and a defocus direction determiner allows the apparatus to determine the direction of defocus based on the sub-resolution feature.

In accordance with an exemplary embodiment, an apparatus and method of determining a magnitude of defocus and direction of defocus for photolithography are provided. The method can analyze a wafer for a sub-resolution feature, determine a magnitude of the sub-resolution feature, calculate a magnitude of defocus and calculate a direction of defocus based on the sub-resolution feature.

Additional advantages of the embodiments will be set forth in part in the description which follows, and in part will be obvious from the description, or may be learned by practice of the teachings. The advantages will be realized and attained by means of the elements and combinations particularly pointed out in the appended claims.

It is to be understood that both the foregoing general description and the following detailed description are exemplary and explanatory only and are not restrictive of the teachings, as claimed.

The accompanying drawings, which are incorporated in and constitute a part of this specification, illustrate embodiments of the teachings and together with the description, serve to explain the principles of the embodiments.

DESCRIPTION OF THE EMBODIMENTS

Figure 1A:
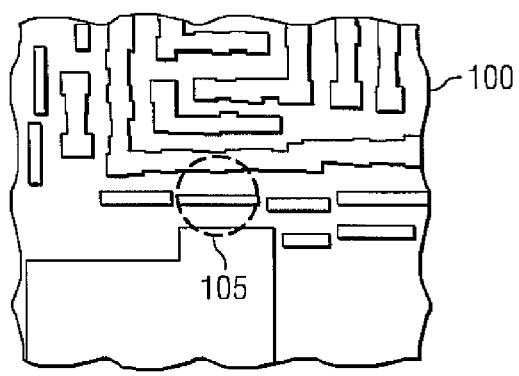
FIG. 1 depicts an example of a reticle used in the creation of a wafer and magnitudes of Sub-Resolution Feature ("SRF") that are produced between two features lines on the wafer at different magnitudes of defocus, in accordance with the principles of the present teachings.
Figure 1D:
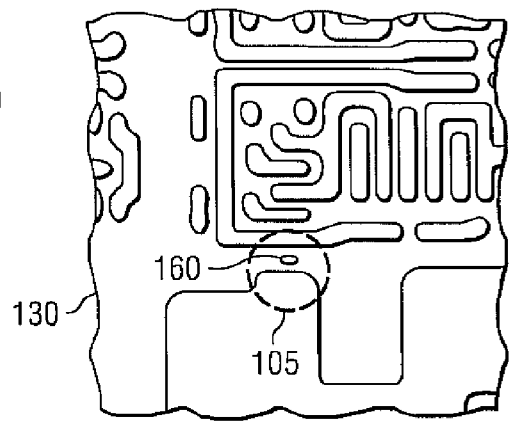
Figure 1B:
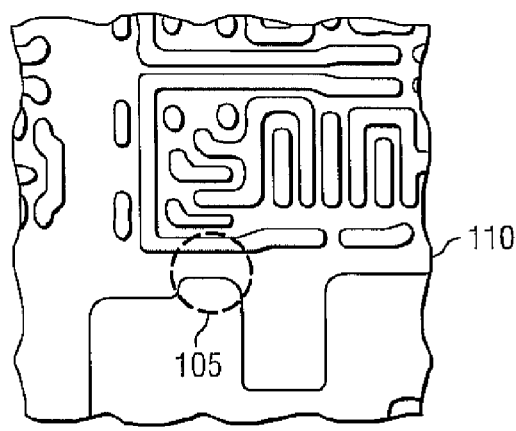
Figure 1E:
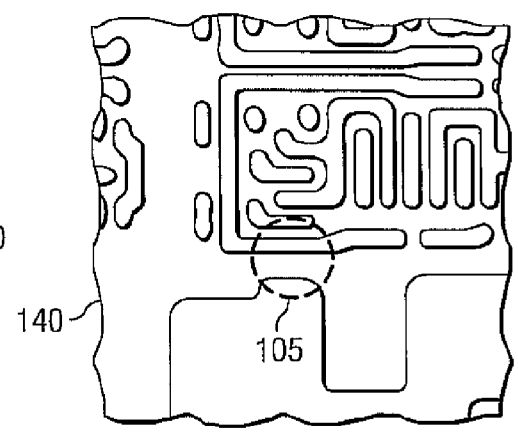
Figure 1C:
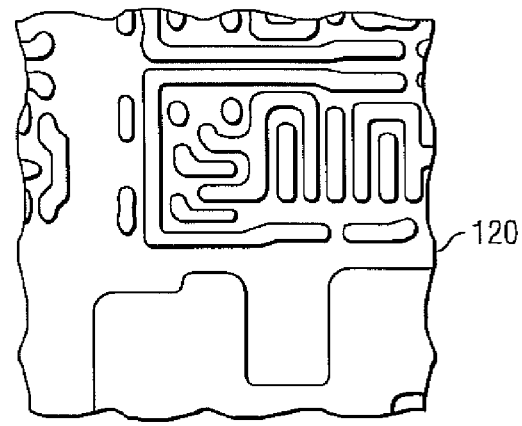
Figure 1F:
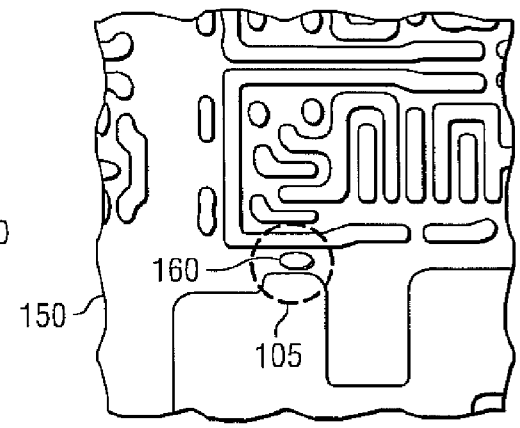

The present teachings use the characteristics of a subresolution assist or similar Sub-Resolution Feature (SRF), i.e., small patterns on a reticle which are not printed on a wafer in a normal exposure condition. SRF printing through various focus offsets is performed to determine the direction of defocus of a patterned wafer. On a patterned wafer, some SRF with appropriate surrounding geometry is printed only in one direction of the defocus, i.e., some SRFs print only in a positive defocus and other SRFs print only in a negative defocus depending on the surrounding geometry.

When a dense-isolate CD bias is larger than some noticeable limit, i.e., the wafer was defocused during exposure, the disclosed SRF inspection can be used to determine if the defocus is on the positive side or the negative side from the optimum focus position. Thus, the direction and amount of focus correction can be estimated from a production wafer without additional focus/exposure matrix wafer printing/inspection.

FIG. 1 shows an example of a reticle 100 that can be used in the creation of a wafer and the SRF 160 produced between two features lines on the wafer at different magnitudes of defocus, in accordance with the principles of the present teachings. The SRF 160 shown in the example of FIG. 1 can allow a determination of the magnitude of defocus and the direction of defocus. The embodiments of the present teachings are not intended to be limited to the SRF illustrated in FIG. 1, with any type of SRF being usable with the teachings that allows a determination of a magnitude of defocus and the defocus direction. Moreover, any area on reticle 100 that produces SRF at various magnitudes of defocus can be used to determine the magnitude and +/- direction of defocus.

Reticle 100 shows an example of a pattern that is used to create the various shots 110, 120, 130, 140 and 150 on a wafer. The various shots 110, 120, 130, 140 and 150 on a wafer can be exposed at various magnitudes of focus, either in a positive or negative direction varying from an extreme negative defocus of F−0.10 um in shot 140 to an extreme defocus of F+0.1 um in shot 150.

Shot 140 shows the magnitude of SRF within area 105 at a focus of F−0.10 um. Shot 110 shows the magnitude of SRF at a focus of F−0.05 um. Shot 120 shows the magnitude of SRF within area 105 at a focus of F0 um. Shot 130 shows the magnitude of SRF within area 105 at a focus of F+0.05 um. Shot 150 shows the magnitude of SRF within area 105 at a focus of F+0.10 um. In the example shown in FIG. 1, only shots 130 and 150 having positive defocus show any substantive amounts of SRF 160.

From the magnitude of SRF 160 observable at various magnitudes of defocus within area 105, a determination can be made of the magnitude and direction of defocus, i.e., only positive defocus wafers 130 and 150 contain SRF 160. This observance can be used to determine the ± direction of defocus, when an iso-dense bias analysis indicates defocus.

Figure 2:
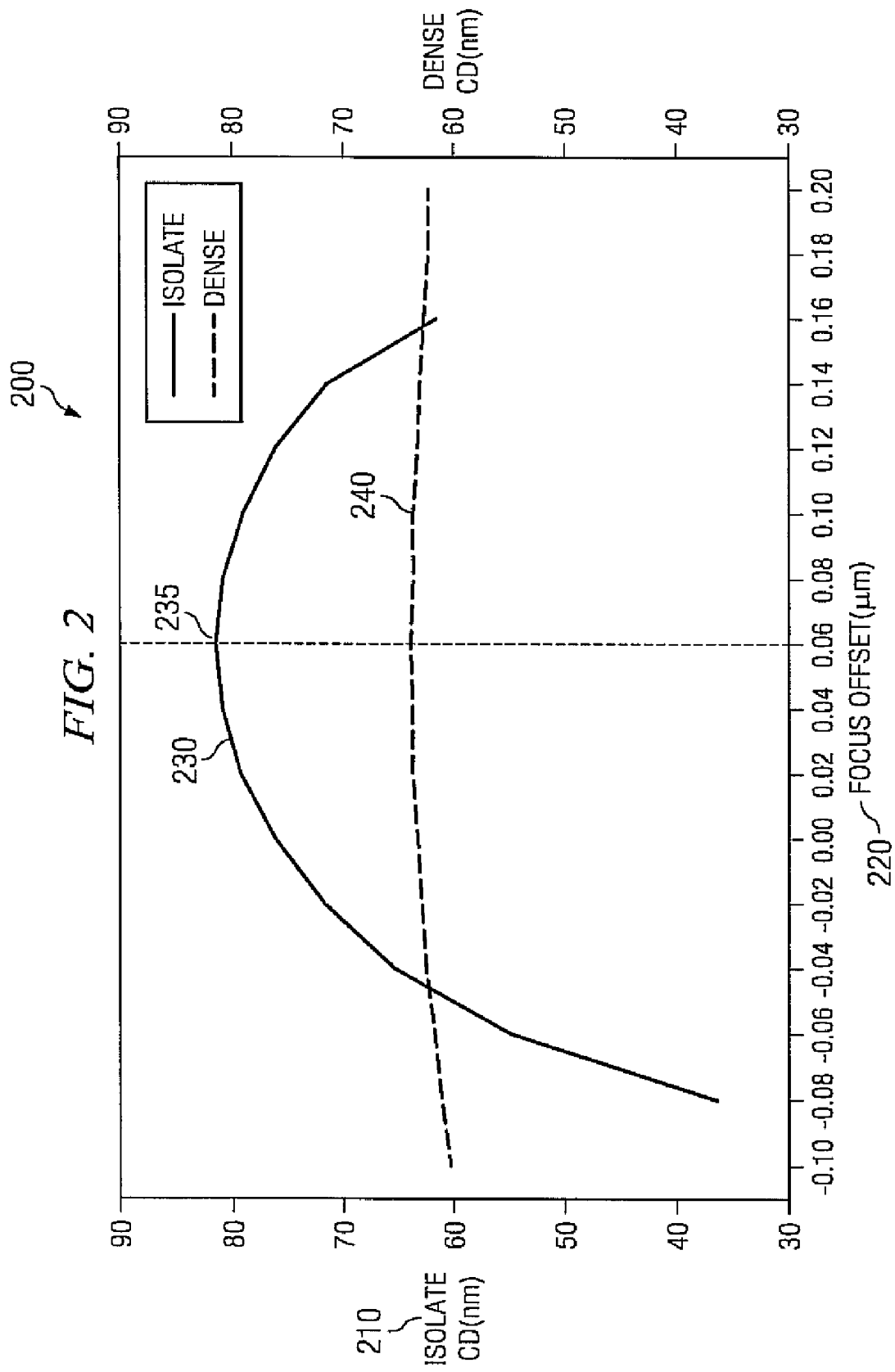
FIG. 2 depicts an exemplary graphic correlation of Critical Dimensions between an isolate feature and a dense feature at various focus offsets, in accordance with the principles of the present teachings.
Figure 3A:
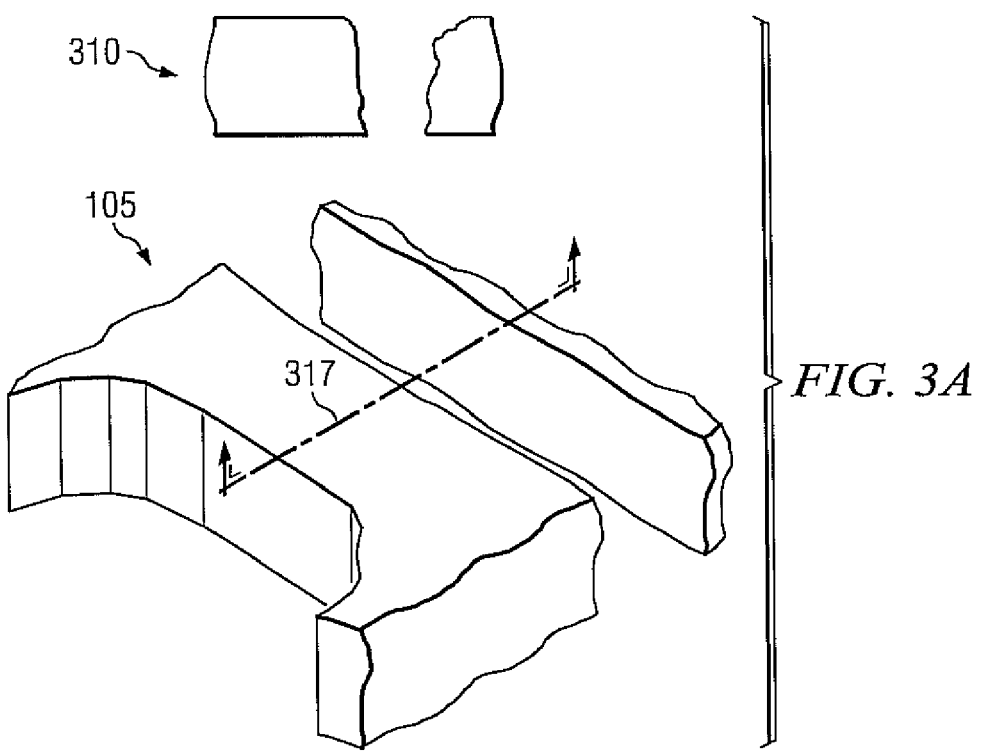
FIG. 3 depicts exemplary microscopic cross-sectional views of a wafer within a given area at various focuses, in accordance with the principles of the present teachings.
Figure 3B:
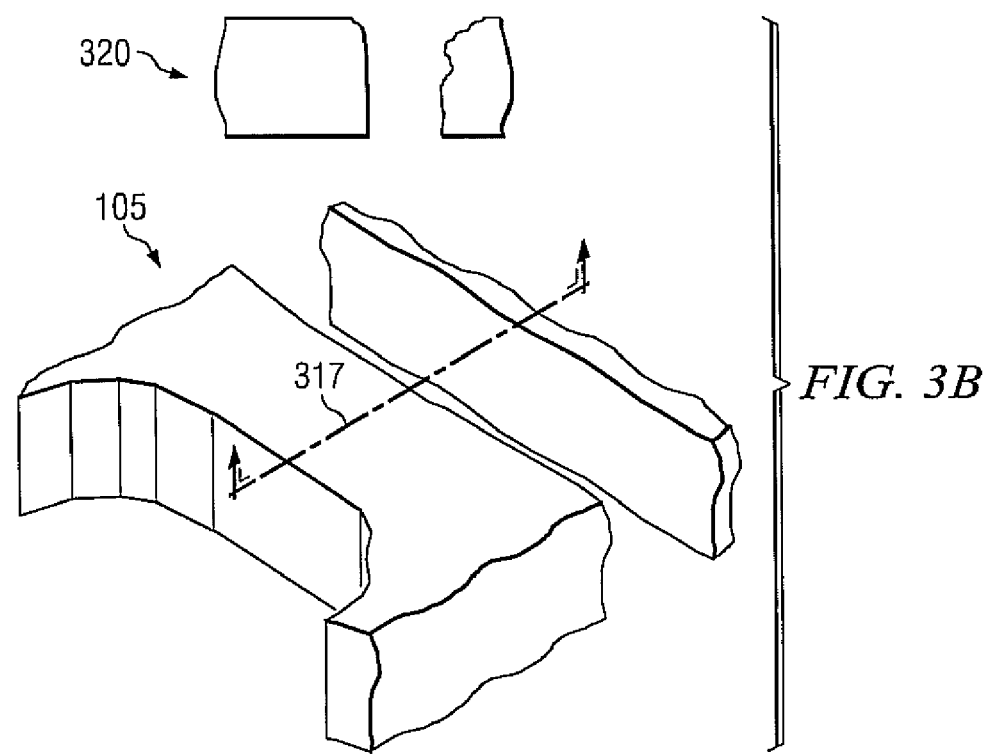
Figure 3C:
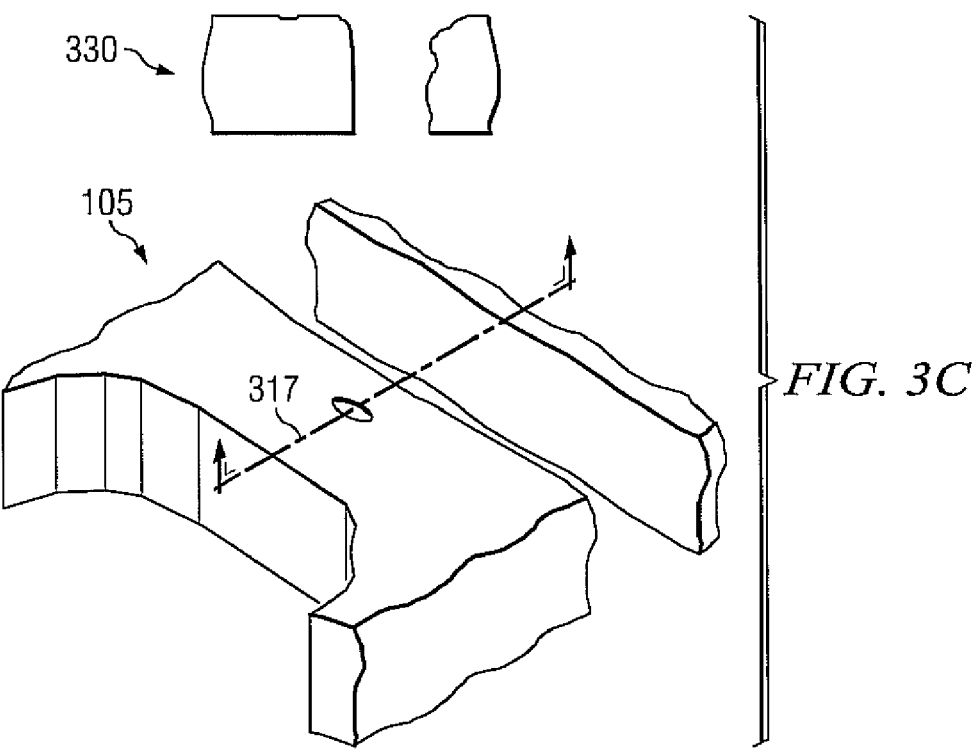
Figure 3D:
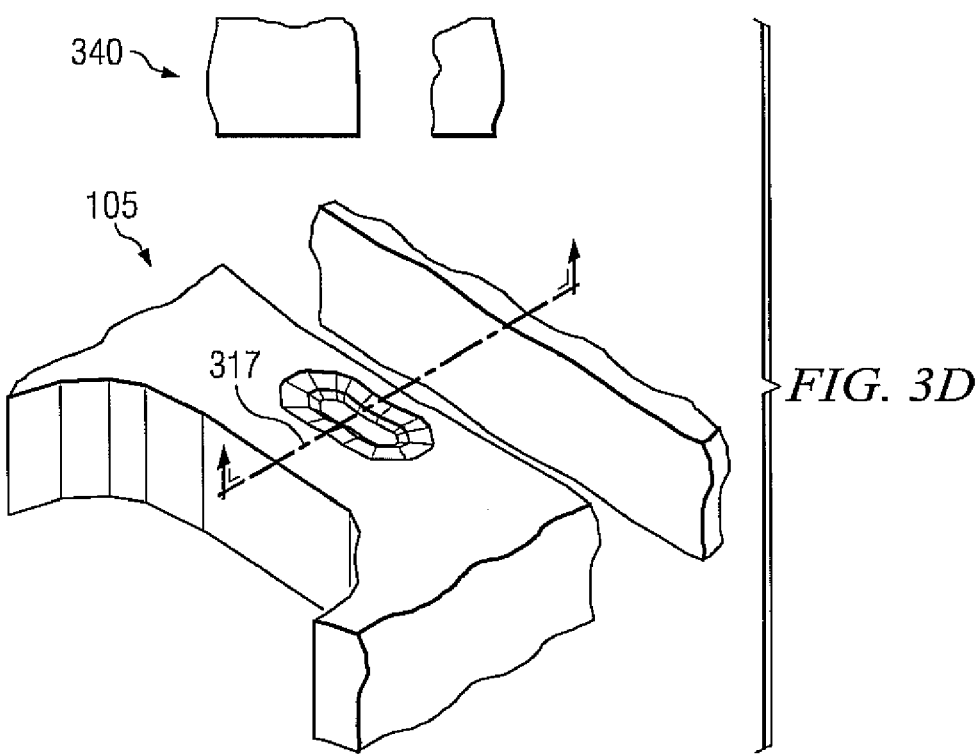
Figure 3E:
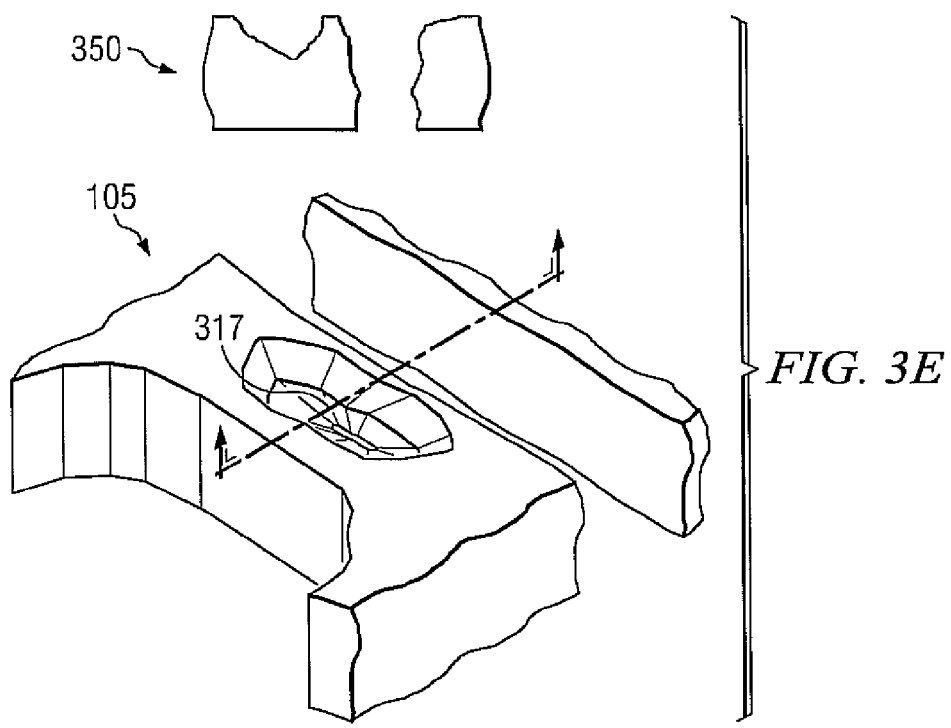
Figure 3F:
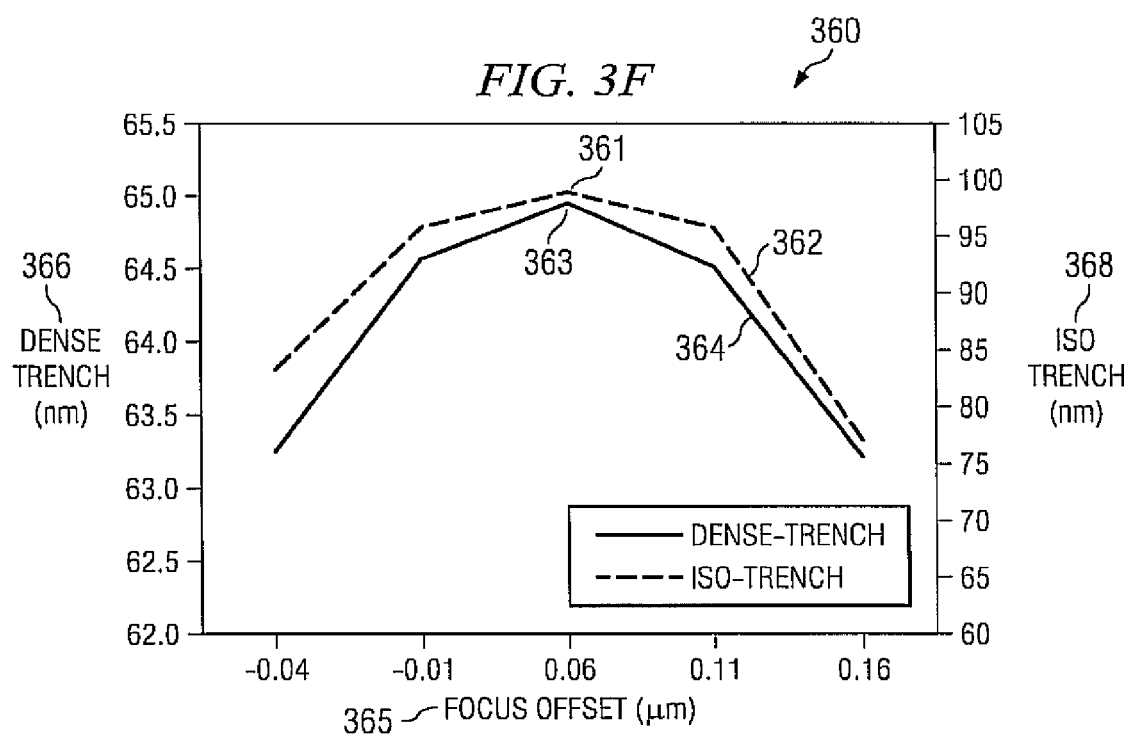

FIG. 2 shows a graphic correlation 200 of CDs between an isolate feature and a dense feature at various focus offsets 220. In particular, the isolate curve 230 shows the magnitudes of variation of CDs of an isolate at focus offsets ranging from F−0.08 um to a focus offset of F+0.16 um. The peak 235 of isolate curve 230 represents an optimal focus, in this example F+0.06.

With dense features, represented by dense curve 240, the magnitude of variation at different focus offsets 220 varies very little. Even at extreme focus offsets of F−0.1 um and F0.2 um, dense feature CDs are not much different than those at the best focus of 0.06 um. In this example, at the peak 235 of isolate curve 230, isolate feature CD is larger than dense feature CD by ~20 nm.

The dense/isolate CD bias correlation shown in FIG. 2 can allow for a determination of the amount of defocus, but not the defocus direction which was determined by the observations from wafers 110, 120, 130, 140 and 150 with varying magnitudes of SRF as shown in FIG. 1.

FIG. 3 shows microscopic cross-sectional views 310, 320, 330, 340 and 350 of a wafer within a given area 105 at various focuses from F−0.04 um to F+0.16 um, in accordance with the principles of the present teachings. To make an accurate comparison of the cross-sectional views 310, 320, 330, 340 and 350, each of the cross-sectional views 310, 320, 330, 340 and 350 can be taken along a roughly identical cross-sectional view plane 317.

As shown in the cross-sectional views, cross-sectional view 310 shows the magnitude of SRF within area 105 at a focus of F−0.04 um. Cross-sectional view 320 shows the magnitude of SRF at a focus of F−0.01 um. Cross-sectional view 330 shows the magnitude of SRF within area 105 at a focus of F+0.06 um. Cross-sectional view 340 shows the magnitude of SRF within area 105 at a focus of F+0.11 um. Cross-sectional view 350 shows the magnitude of SRF within area 105 at a focus of F+0.16 um. In the example shown in FIG. 3, only cross-sectional views 340 and 350 having positive defocus show any observable amounts of SRF 160. The cross-sectional views 310, 320, 330, 340 and 350 of a wafer within area 105 at various focuses from F−0.04 um to F+0.16 um can allow for either a visual and/or CDSEM inspection for a determination of the amount of defocus and the direction of defocus.

Moreover, FIG. 3 shows a graphic correlation 360 between a dense feature CD 366, and isolate feature CD 368 for various focus offsets 365. For isolated features, curve 362 shows that optimal focus 361 occurs at F+0.06 um. For dense features, curve 364 again shows that the optimal focus occurs at F+0.06 um.

Moreover, FIG. 3 shows a graphic correlation 370 of the CD bias (Iso feature CD—dense feature CD) produced at various focus offsets 371. Bias curve 371 shows that if iso-dense bias of some patterned wafers go below ~30 nm, the wafers were defocused during exposure. The direction of defocus can then be determined by reviewing SRF printing behavior as disclosed herein.

Figure 4:
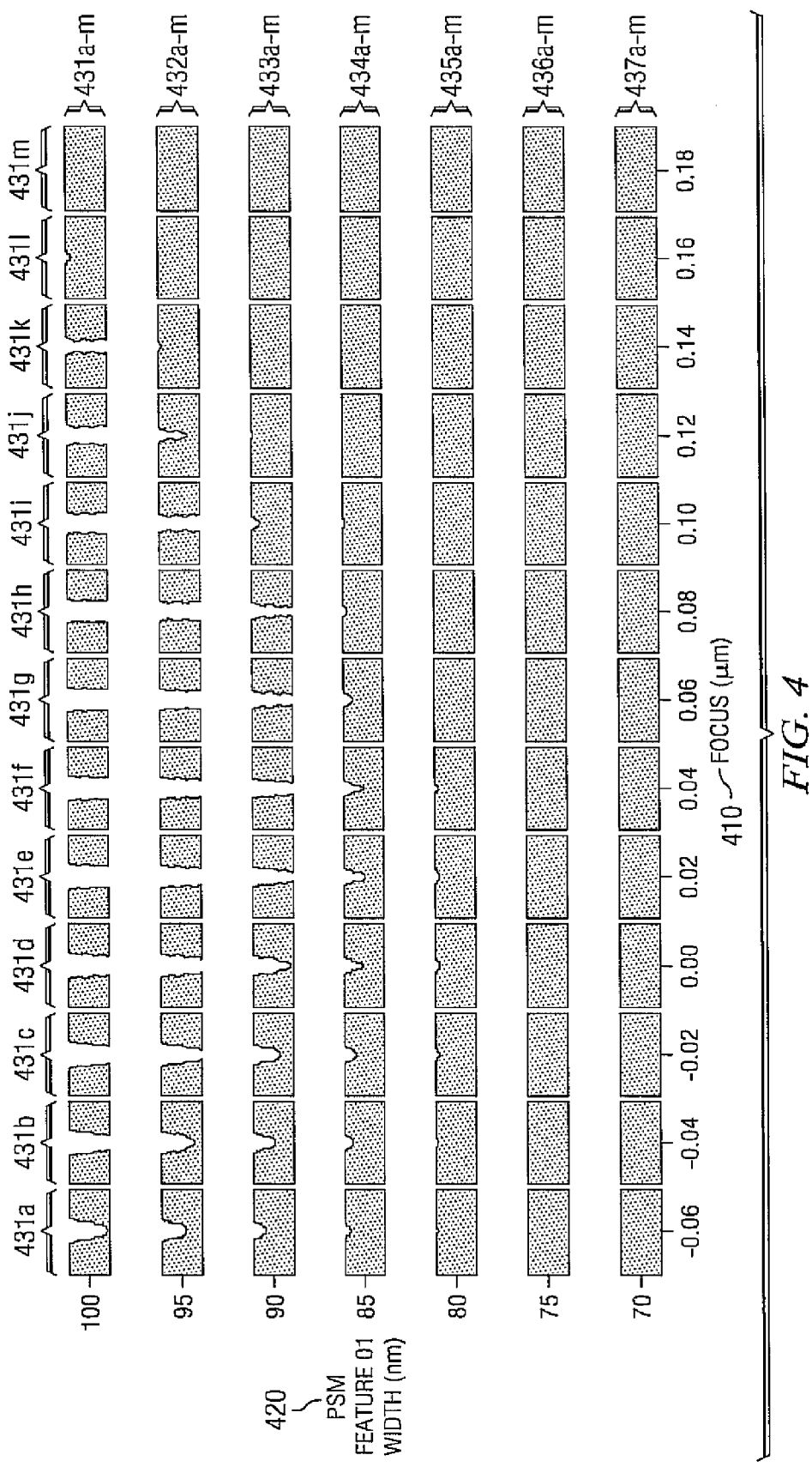
FIG. 4 depicts exemplary images depicting the magnitudes of SRF that is produced at different focus offsets at differing feature widths, in accordance with the principles of the present teachings.
Figure 5A:
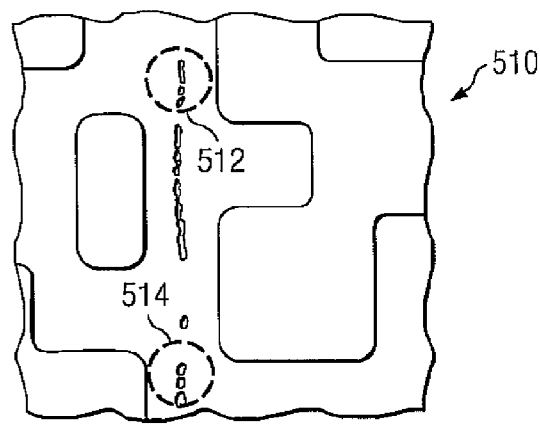
FIG. 5 depicts exemplary types of SRF that are produced with different neighbor geometries, in accordance with the principles of the present teachings.
Figure 5D:
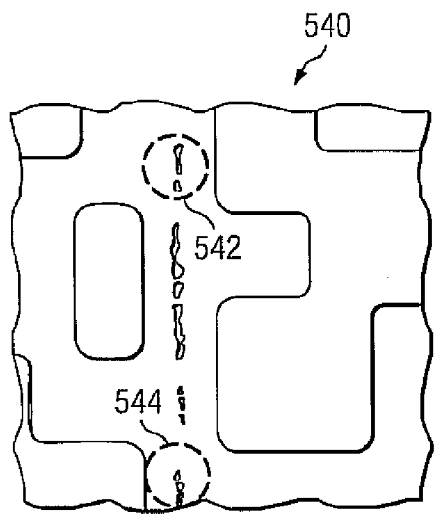
Figure 5B:
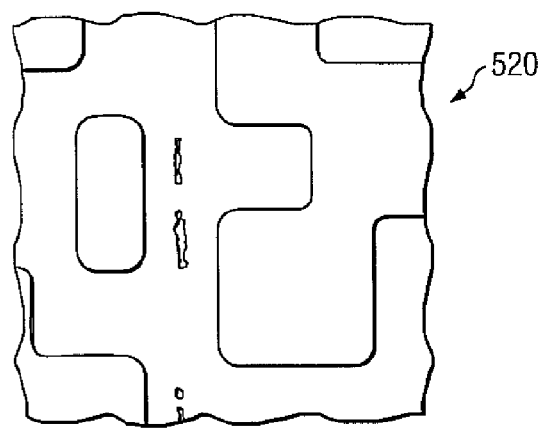
Figure 5E:
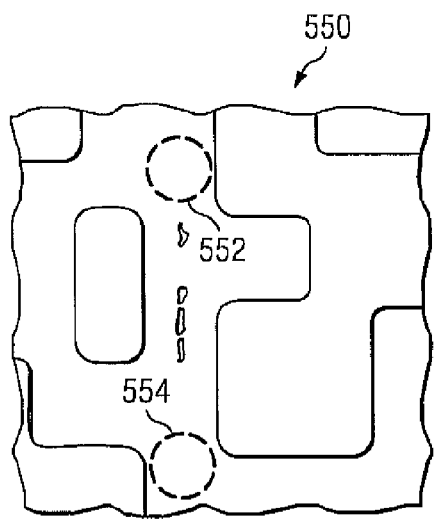
Figure 5C:
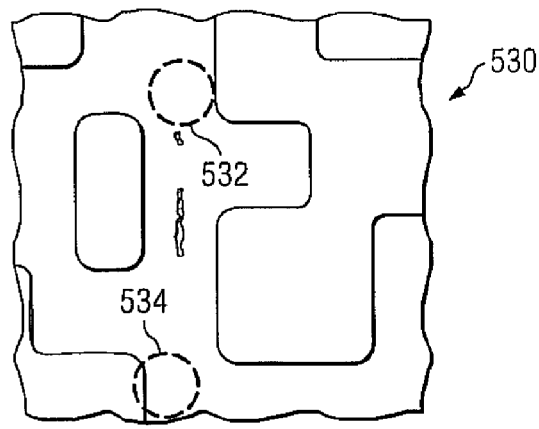
Figure 6A:
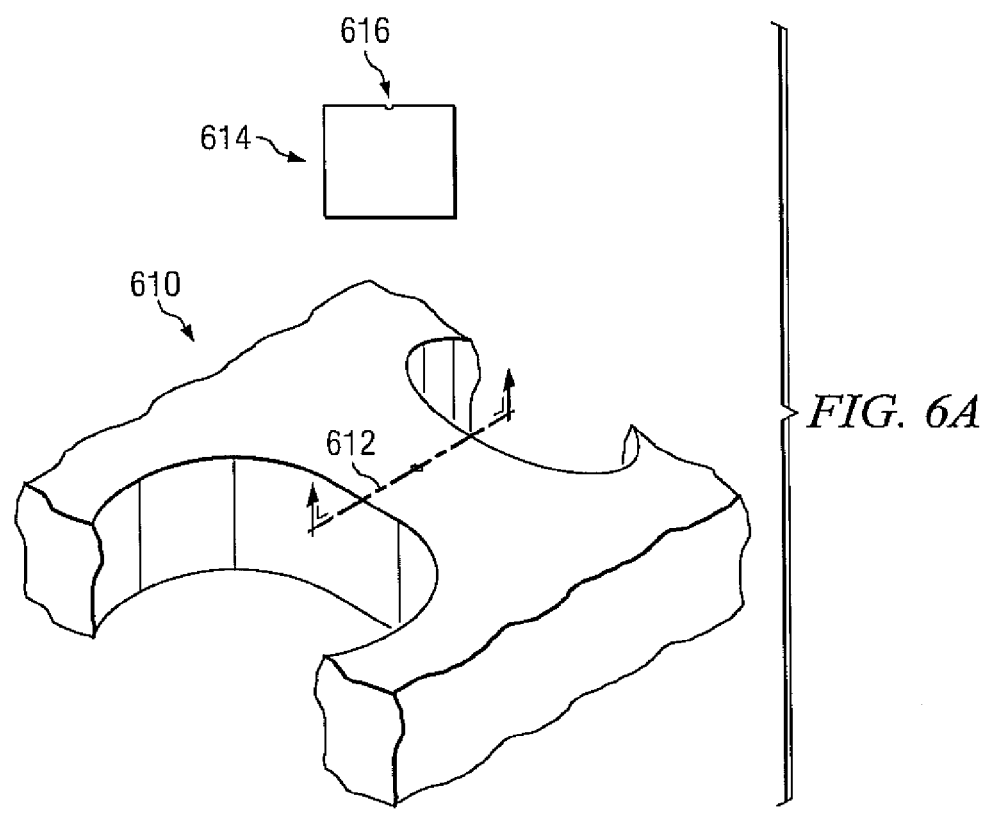
FIG. 6 depicts exemplary SRF produced between two neighboring features produced from an attenuated PSM (Phase Shift Mask) that have SRF printing only with positive defocus, in accordance with the principles of the present teachings.
Figure 6B:
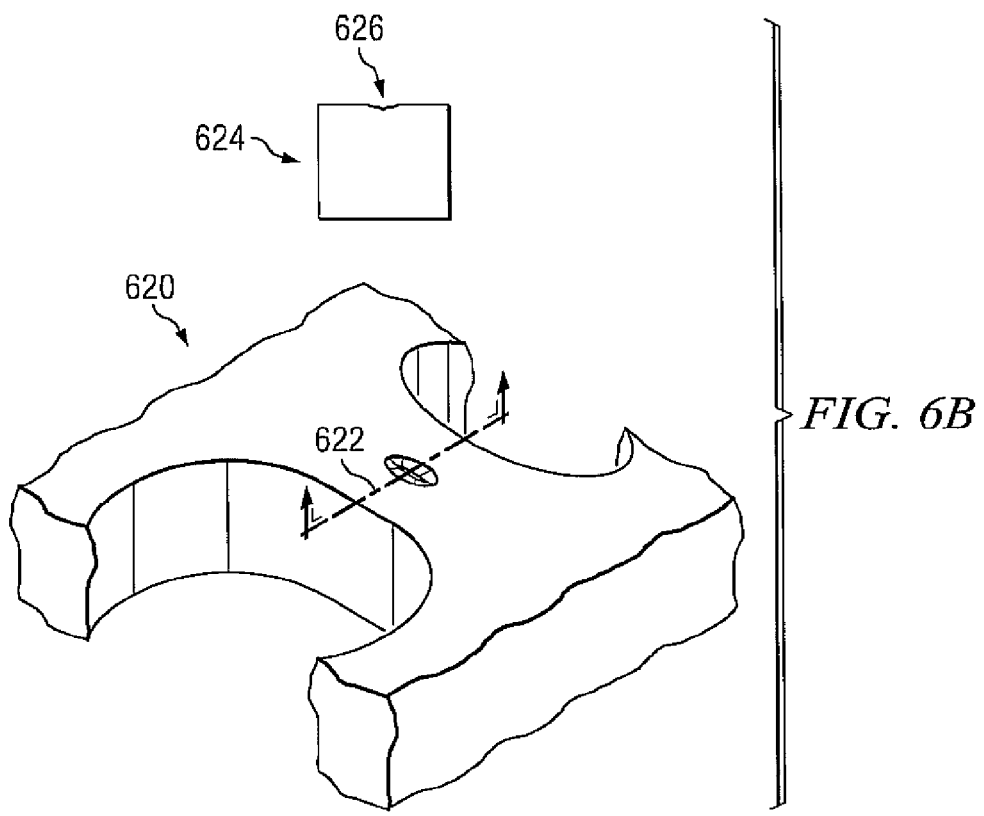
Figure 6C:
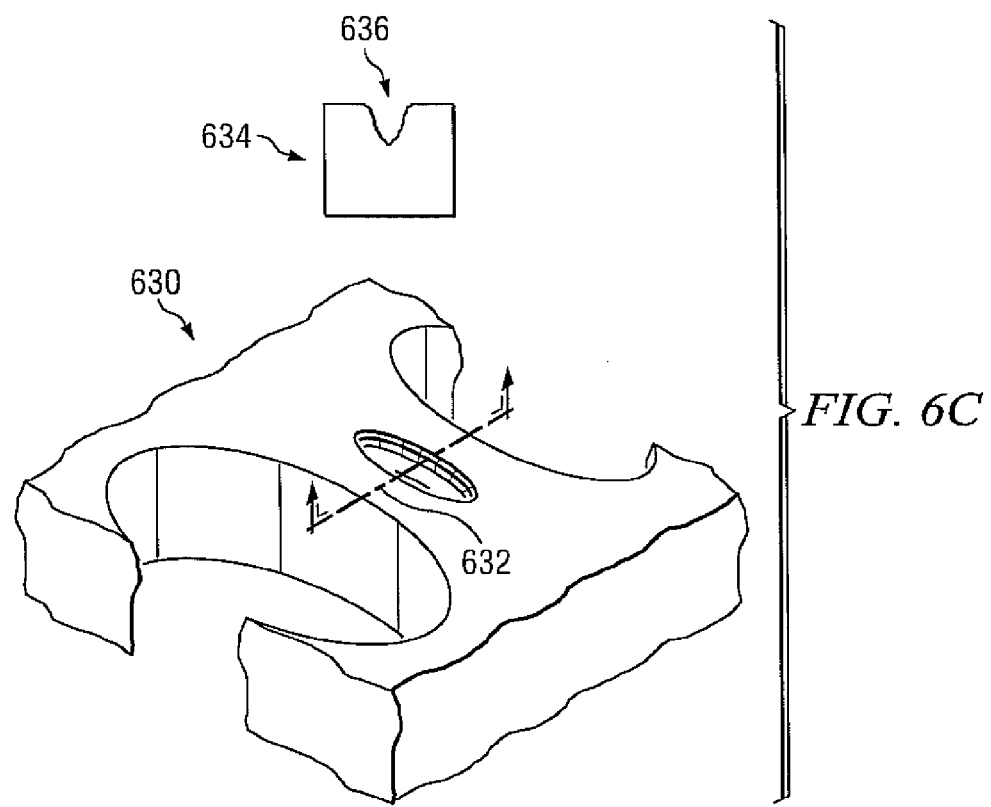
Figure 6D:
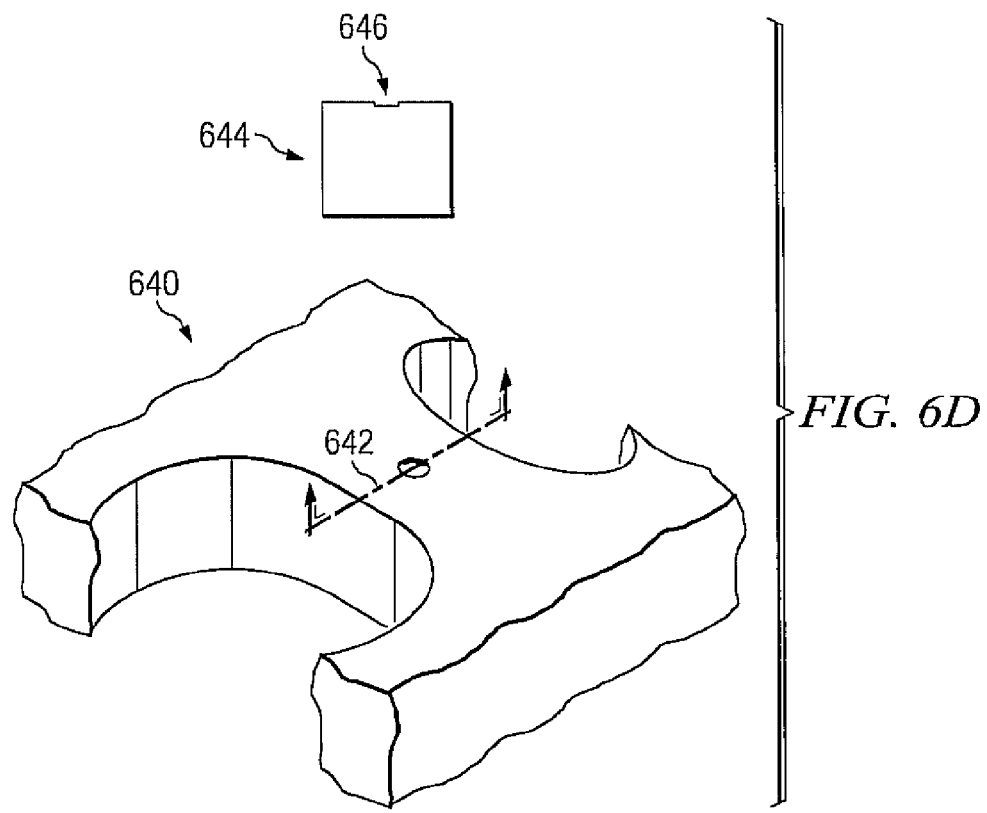
Figure 6E:
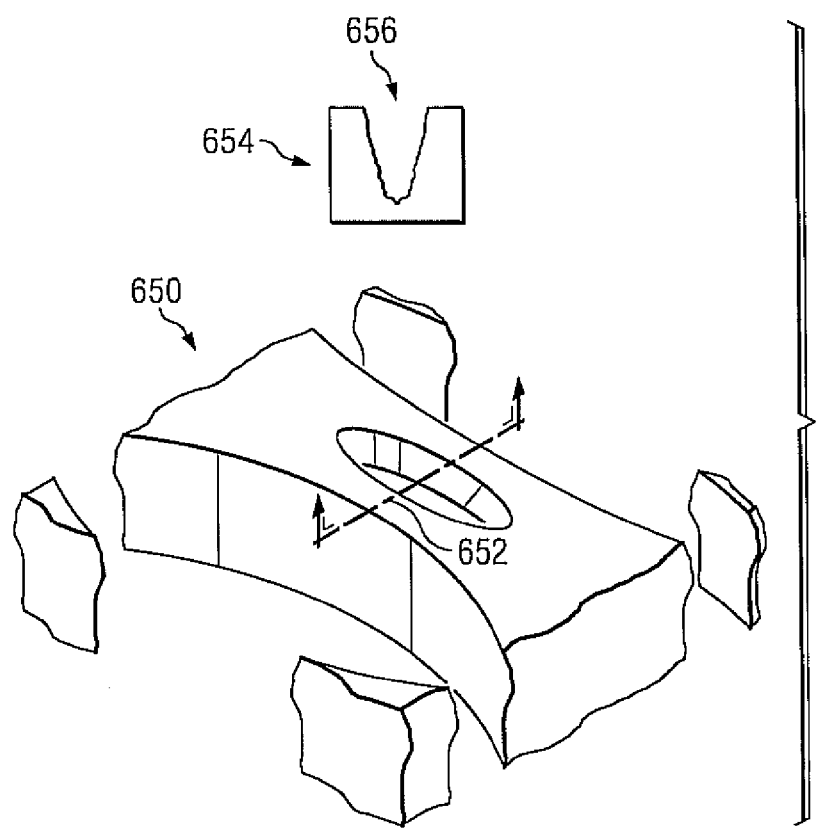
Figure 7A:
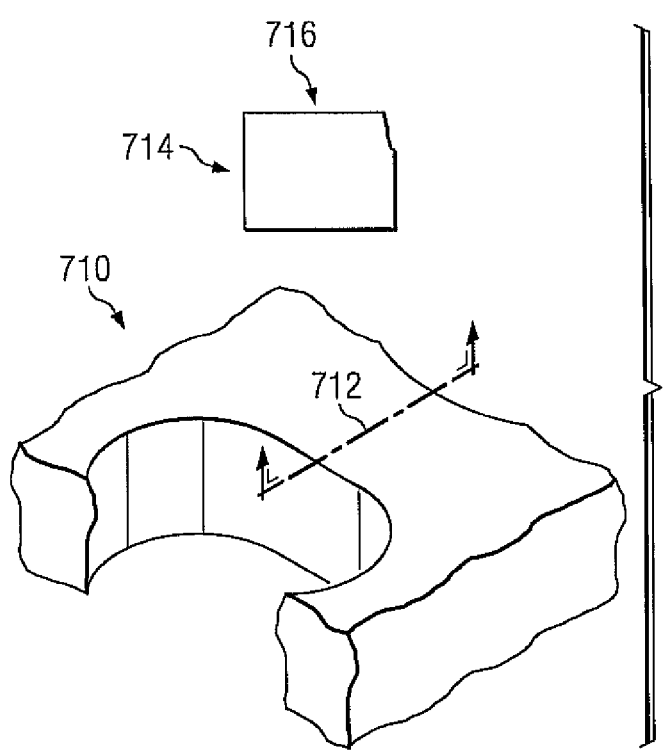
FIG. 7 depicts exemplary SRF produced adjacent to a feature on a wafer, in accordance with the principles of the present teachings.
Figure 7B:
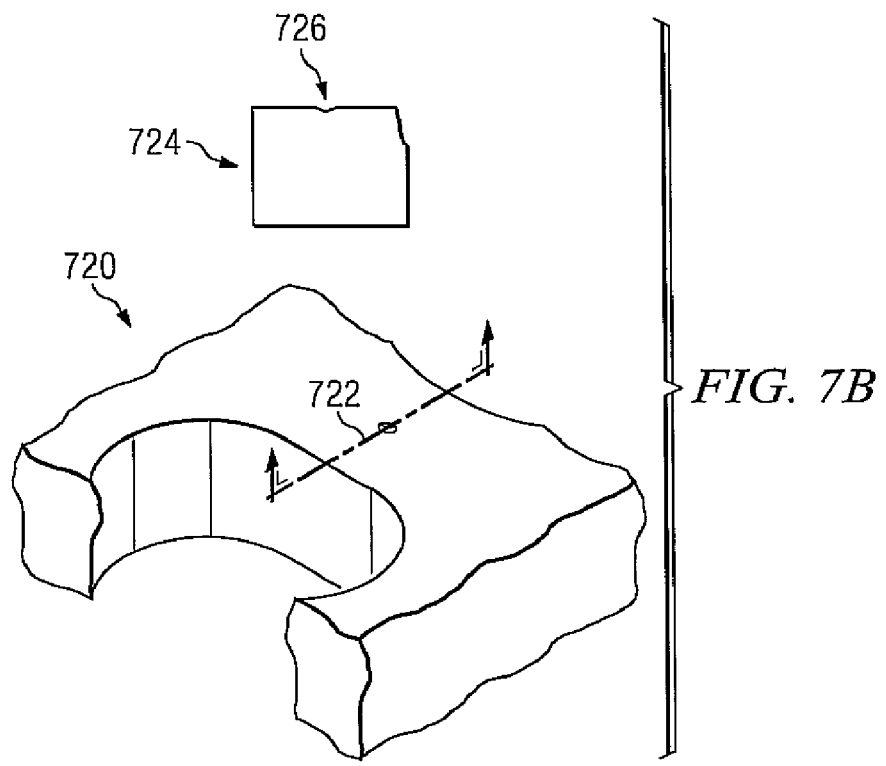
Figure 7C:
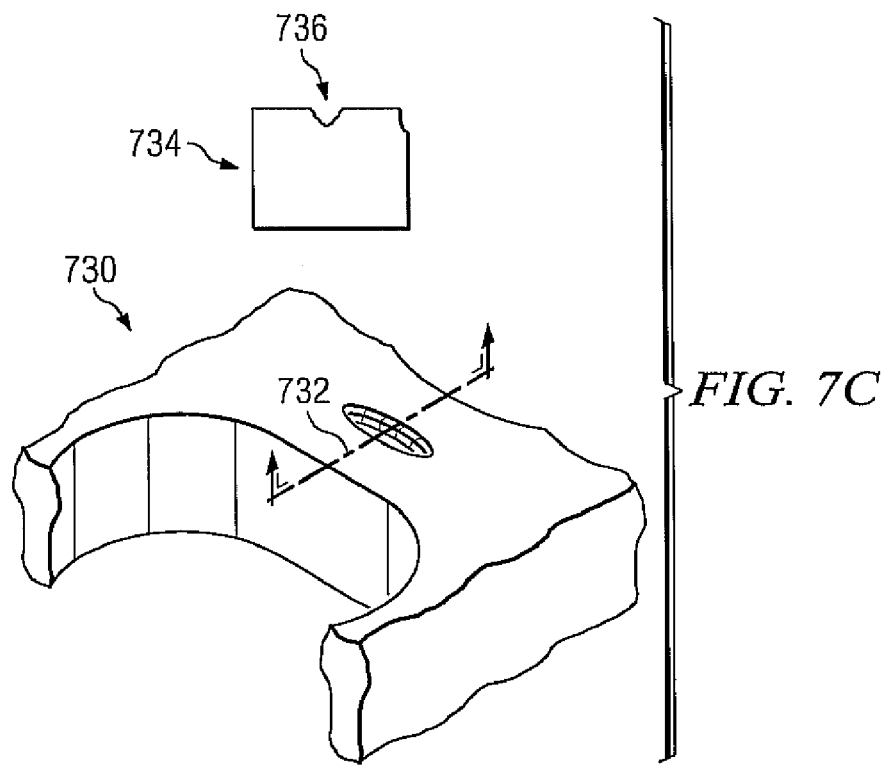
Figure 7D:
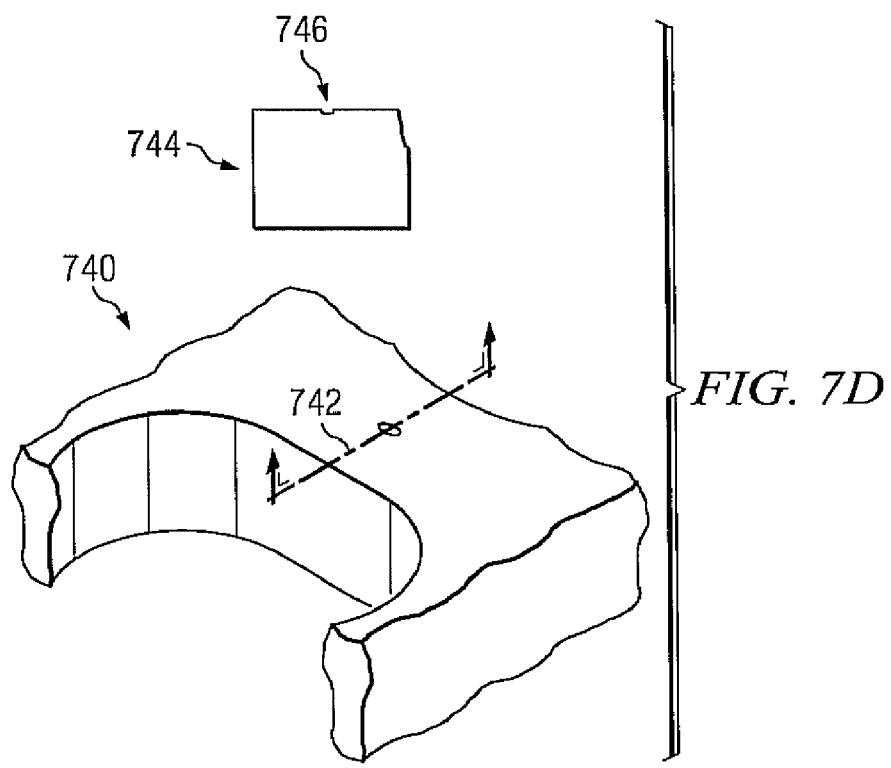
Figure 7E:
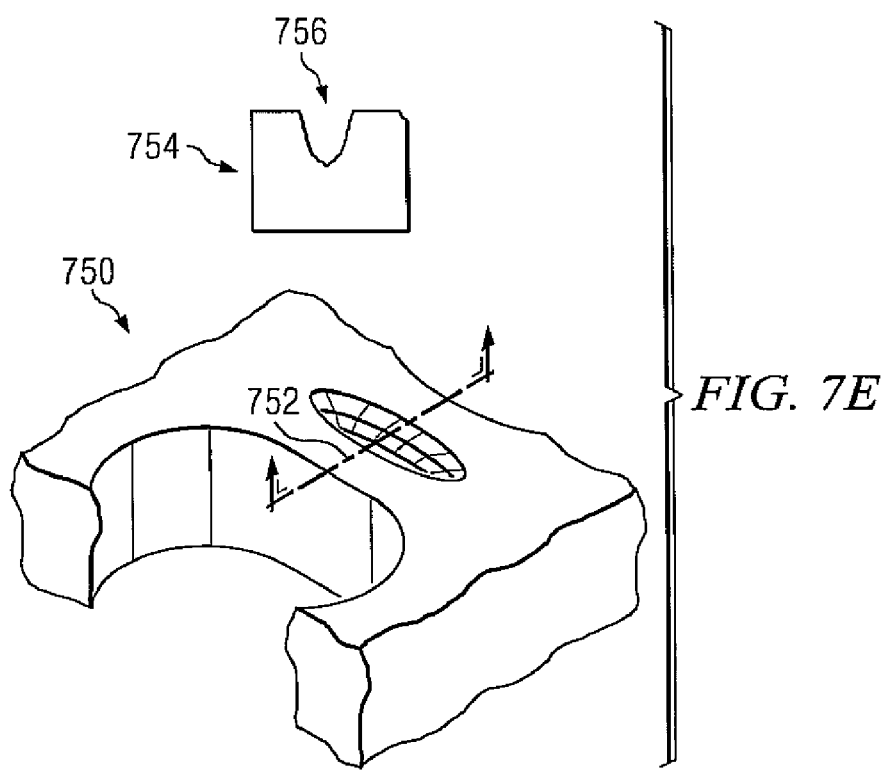

FIG. 4 shows an example of the magnitudes of SRF that are produced at different focus offsets with neighbors having differing feature widths, in accordance with the principles of the present teachings. In particular, the horizontal axis 410 represents various focus offsets ranging from F−0.06 um to F+0.18 um in F±0.02 increments that the various shots 431*a-m*, 432*a-m*, 433*a-m*, 434*a-m*, 435*a-m* and 436*a-m* are created at. The vertical axis 420 can represent a range of attenuated Phase Shift Mask feature widths from ~70 nm to ~100 nm in ~10 nm increments.

With a Phase Shift Mask feature width of ~100 nm, the optimal focus offset is F+0.06, shown as shot 431*g*. The feature produced gradually degrades as the focus offset moves in either the positive or negative direction from the optimal focus. At a Phase Shift Mask feature width of approximately ~80-85 nm, SRF is shown to form as a feature that is not fully patterned to the bottom of resist, and barely visible at the optimum focus offset of 0.06 um. The SRF produced on shot 434*e* has an optimal defocus of F+0.02 um. In this example SRF is visible only at the negative side of defocus. FIG. 4's shows an example where SRF is only printed at the negative defocus, while the SRF shown in FIG. 1 which was placed between large main features is printed only at the positive defocus. Thus, SRF can be used to determine both positive and negative defocus.

When a Phase Shift Mask feature becomes small enough, i.e., when it can be considered as an SRF, only negative defocus will produce SRF. For example, for a Phase Shift Mask feature of ~85 nm, only wafers 434*b-f* produced with respective focus offsets of F−0.04 um to F+0.04 produce substantive defocus patterns. The SRF produced at a width of ~85 nm can be analyzed to determine the magnitude of negative defocus and the direction of defocus. As can be seen from wafer 434*e*, the isolate SRF trench pattern without any surrounding patterns has an optimal focus at ~0.02 um, −40 nm from the normal pattern optimal focus shown in wafer 431*g*.

At a Phase Shift Mask feature width at and below approximately 75 nm, the SRF produced can become negligible and does not assist in a determination of the amount and/or the direction of defocus.

FIG. 5 shows examples of the different types of SRF that are produced with different neighbor geometries, i.e, wafer data, from those produced in the example shown in FIG. 1, in accordance with the principles of the present teachings. In particular, FIG. 5 shows an example where SRF is only produced with negative defocus.

All of the examples shown in FIG. 5 are printed at 39 mj and have dense feature width of ~60 nm. Shot 540 is printed with a focus offset of F−0.1 um. The circle areas 542 and 544 show the magnitude of SRF produced at F−0.1um. Shot 510 is printed with a focus offset of F−0.05 um. The circle areas 512 and 514 show the magnitude of SRF produced at F−0.05 um. Shot 520 is printed a focus offset of 0 um and has negligible amounts of SRF. Shot 530 is printed with a focus offset of F+0.05 um. The circle areas 532 and 534 show the magnitude of SRF produced at F+0.05 um, showing negligible amounts of SRF. Shot 550 is printed with a focus offset of F+0.1 um. The circle areas 552 and 554 show the magnitude of SRF produced at F+0.1 um, showing negligible amounts of SRF.

Thus, a comparison of shots 510, 520, 530, 540 and 550 having a dense feature width of ~60 nm reveals that only negative defocus produces any substantive amount of SRF. Knowing that only negative defocus produces any substantive amounts of SRF from the examples, an analysis of the magnitude of SRF from shots 510 and 540 can allow a determination of the magnitude of negative defocus.

FIG. 6 shows exemplary SRF produced between two large neighboring features produced from an attenuated PSM (Phase Shift Mask) that have SRF printing only with positive defocus similar to that shown in FIG. 1, in accordance with the principles of the present teachings.

A cross-sectional view 644 of shot 640 along cross-section axis 642 shows the SRF 646 produced at F−0.04 um is nominal. A cross-sectional view 614 of shot 610 along cross-section axis 622 shows the SRF 616 produced at F+0.01 um is still nominal. A cross-sectional view 624 of shot 620 along cross-section axis 622 shows the SRF 626 produced at F0.06 um is still nominal However, a cross-sectional view 634 of shot 630 along cross-section axis 632 shows the SRF 636 produced at F+0.11 um is substantial compared to the SRFs 646, 616 and 626 produced respectively on shots 640, 610 and 620. A cross-sectional view 654 of shot 650 along cross-section axis 652 shows the SRF 656 produced at F+0.16 um is even greater that-than the SRF produced at F+0.11 um with a reticle feature width of 38 nm.

The example in FIG. 6 shows how an analysis of SRFs 636 and 656 can be used to determine the magnitude of defocus and the direction of defocus. As can be seen from shots 630 and 650, the magnitude of SRFs 636 and 656 produced as defocus moves from F0.11 um to F0.16 um is approximately twice as deep. The magnitude of positive defocus can be determined from an analysis of the magnitude of SRF produced.

FIG. 7 shows another example of the SRF produced adjacent to a feature on a wafer, in accordance with the principles of the present teachings. In this example, SRF is only produced at defocus greater than an optimal focus of F+0.06. The results shown in FIG. 7 are produced with a binary(Chrome) mask, rather than an attenuated PSM. Thus, both a binary (Chrome) mask and an attenuated PSM can be used for SRF printing observation at only one side of defocus.

A cross-sectional view 744 of shot 740 along cross-section axis 742 shows the SRF 746 produced at F−0.04 um is nominal. A cross-sectional view 714 of shot 710 along cross-section axis 722 shows the SRF 716 produced at F+0.01 um is still nominal. A cross-sectional view 724 of shot 720 along cross-section axis 722 shows the SRF 726 produced at F0.06 um is still nominal. However, a cross-sectional view 734 of shot 730 along cross-section axis 732 shows the SRF 736 produced at F+0.11 um is substantial compared to the SRFs 746, 716 and 726 produced respectively on shot 740, 710 and 720. A cross-sectional view 754 of wafer 750 along cross-section axis 752 shows the SRF 756 produced at F+0.16 um is even greater that the SRF produced at F+0.11 um with a reticle feature width of 42 nm.

The example in FIG. 7 shows how an analysis of SRFs 736 and 756 can be used to determine the magnitude of defocus in a positive direction. As can be seen from wafers 730 and 750, the magnitude of SRFs 736 and 756 produced as defocus moves from F0.11 um to F0.16 um is approximately three times as deep. The magnitude of positive defocus can be determined from an analysis of the magnitude of SRF produced.

Figure 8:
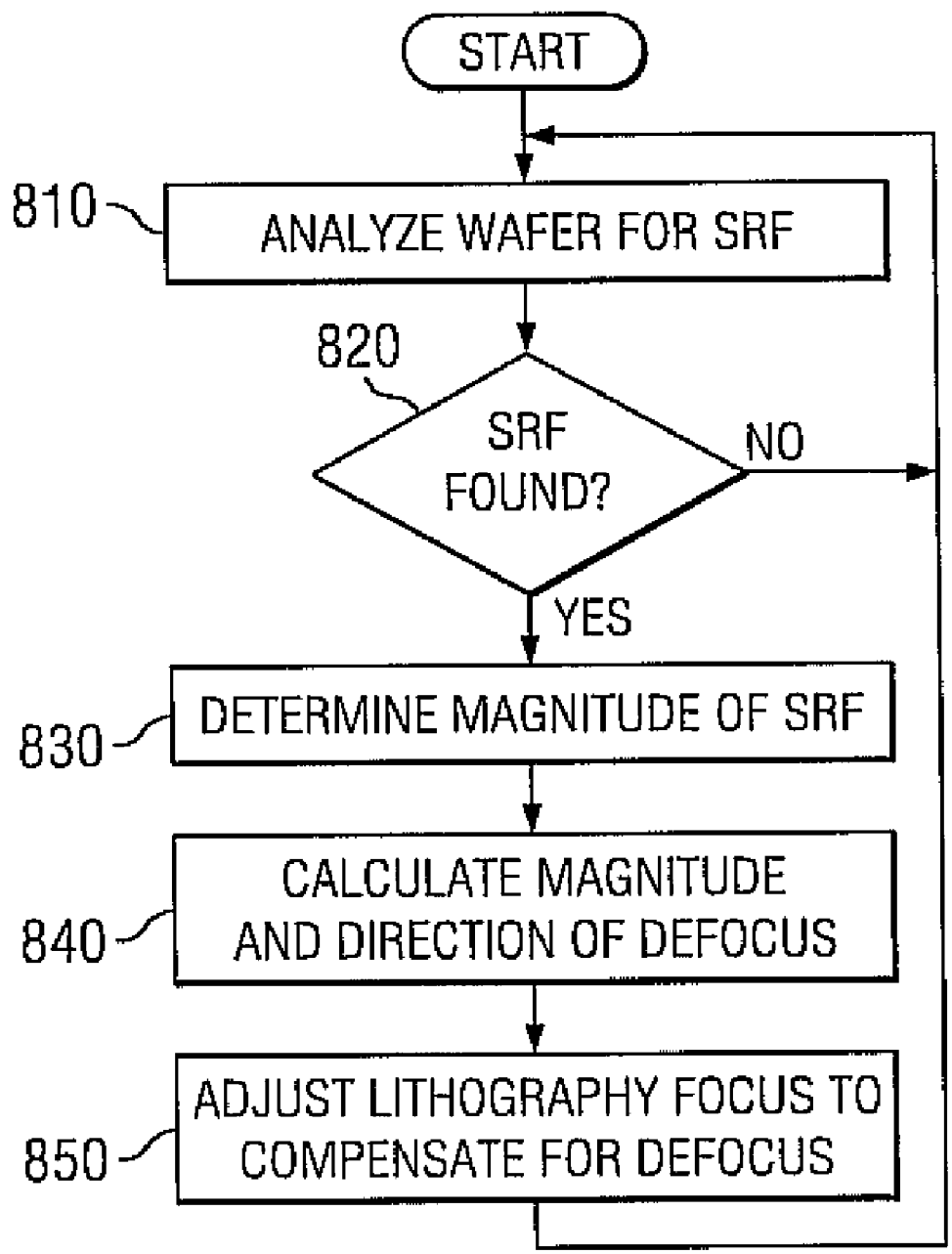
FIG. 8 depicts an exemplary method by which SRF is used to determine a magnitude and direction of defocus of a lithography process, in accordance with the principles of the present teachings.

FIG. 8 shows an example of a method by which SRF is used to determine a magnitude and direction of defocus of a lithography process, in accordance with the principles of the present teachings.

In step 810, a wafer that has completed a lithography process can be analyzed to determine if the wafer contains any substantive amount of SRF. As shown in FIGS. 1-7, a small amount of SRF is indicative of small defocus. A small amount of defocus can be acceptable for most applications without greatly changing the tolerances of the components being created on a wafer. However, if an application requires that the tolerances do not allow for great tolerance fluctuations, even a small amount of SRF must be analyzed to compensate for defocus. Regular dense and iso feature's CDs can be measured, and iso-dense bias exceeding the allowable limit indicates significant defocus. Once defocus is determined significant, an SRF area can be checked to determine the direction of defocus, with the amount of defocus estimated based on the iso-dense CD bias or on the size of printed SRF.

In step 820, a decision can be made if an amount of SRF that requires action has been found on the wafer, i.e., if the SRF is greater than a predetermined value. If no such SRF is found on the wafer that requires action, the process branches to step 810 to inspect another wafer. If such SRF is found on the wafer that requires action, the process branches to step 830.

In step 830, the magnitude of SRF can be determined.

In step 840, the existence of SRF and the magnitude of the SRF as determined in step 830 can be used to calculate the magnitude and direction of defocus.

In step 850, the calculated magnitude and direction of defocus from step 840 can be used to adjust the lithography defocus in either a positive or negative direction to compensate for the calculated defocus. The process then branches to step 810 to inspect another wafer.

Defocus may increase over time. To limit the impact on production of shots, the process as disclosed in FIG. 8 is preferably executed on every Nth shot as they leave a lithography process, with the value of N varying based on the types of shots being produced, the tendency of the lithography equipment to lose focus, the magnitude of accuracy of features necessary for a particular application, etc. However, for applications where feature tolerances are crucial, such as military applications, every shot leaving a lithography process may be inspected for SRF/defocus.

Although the process as disclosed in FIG. 8 can be executed through human observation and calculations, preferably the process as disclosed in FIG. 8 can be automated for execution on a computer that would require little to no human intervention to determine the magnitude of defocus and the direction of defocus.

While the embodiments has been illustrated with respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the teachings will be apparent to those skilled in the art from consideration of the specification and practice of the teachings disclosed herein. It is intended that the specification and examples be considered as exemplary only, with a true scope and spirit of the teachings being indicated by the following claims.

What is claimed is:

1. A method for fabricating an integrated circuit using photolithography equipment for imaging dense and isolated features having a critical dimension, comprising:
   in a first imaging process, imaging integrated circuit dense and isolate features having the critical dimension by passing radiation through a reticle onto one or more radiation sensitive layers of one or more wafers, to provide a plurality of shots made at respective focus offsets of different magnitudes and directions from a given focus;
   establishing a dense and isolate feature critical dimension bias correlation for the shots made in the first imaging process;
   determining an offset direction for subresolution assist features imaged in the shots made in the first imaging process;
   in a second imaging process, imaging the integrated circuit dense and isolate features having the critical dimension by passing radiation through the reticle onto a radiation sensitive layer of a production wafer;
   determining a defocus condition in the second imaging process;
   determining an amount and direction of focus correction needed for the second imaging process based on the dense and isolate feature critical dimension bias correlation and the imaged subresolution assist feature offset direction;
   adjusting the focus for the second imaging process based on the determined amount and direction of focus correction needed; and
   repeating the second imaging process for another wafer using the adjusted focus.

2. . The method of claim 1, wherein the imaging in the first and second imaging processes is done using a binary mask.

3. The method of claim 1, wherein the imaging in the first and second imaging processes is done using a phase shift mask.

4. The method of claim 1, wherein at least the steps of establishing the dense and isolate feature critical dimension bias correlation and determining the offset direction are automated and executed using a computer.

5. The method of claim 1, wherein the wafer of every Nth shot made in the second imaging process is considered for determining the defocus condition, determining the focus correction, and adjusting the focus.

6. The method of claim 5, wherein a determination of N is made based on at least one of types of shots produced, tendency of lithography equipment to lose focus, magnitude of accuracy of features needed for a particular application, and application of the integrated circuit.

7. The method of claim 1, wherein the plurality of shots made at respective focus offsets of different magnitudes and directions from the given focus includes shots made at focus offsets of −0.05um, −0.1um, 0um, +0.05um and +0.1um from the given focus.

* * * * *